(12) United States Patent
Xie et al.

(10) Patent No.: US 11,315,799 B2
(45) Date of Patent: Apr. 26, 2022

(54) BACK END OF LINE STRUCTURES WITH METAL LINES WITH ALTERNATING PATTERNING AND METALLIZATION SCHEMES

(71) Applicant: International Business Machines Corporation, Armonk, NY (US)

(72) Inventors: Ruilong Xie, Niskayuna, NY (US); Chanro Park, Clifton Park, NY (US); Chih-Chao Yang, Glenmont, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 17/133,919

(22) Filed: Dec. 24, 2020

(65) Prior Publication Data

US 2021/0151327 A1 May 20, 2021

Related U.S. Application Data

(62) Division of application No. 16/570,316, filed on Sep. 13, 2019, now Pat. No. 10,950,459.

(51) Int. Cl.
*H01L 21/311* (2006.01)
*H01L 23/532* (2006.01)
(Continued)

(52) U.S. Cl.
CPC .... *H01L 21/31144* (2013.01); *H01L 21/0332* (2013.01); *H01L 21/76834* (2013.01); *H01L 21/76879* (2013.01); *H01L 23/53209* (2013.01)

(58) Field of Classification Search
CPC ........... H01L 21/31144; H01L 21/0332; H01L 21/76834
See application file for complete search history.

(56) References Cited

U.S. PATENT DOCUMENTS 9,041,217 B1   5/2015   Bristol et al.
9,478,462 B1   10/2016  Wang et al.
(Continued)

OTHER PUBLICATIONS

B.D. Briggs et al., "Process Challenges in Fully Aligned Via Integration for sub 32 nm Pitch BEOL," International Interconnect Technology Conference (IITC) 2018, p. 148.
(Continued)

*Primary Examiner* — Errol V Fernandes
(74) *Attorney, Agent, or Firm* — L. Jeffrey Kelly; Ryan, Mason & Lewis, LLP

(57) ABSTRACT

Techniques are provided to fabricate semiconductor devices. For example, a method includes forming an interconnect structure having a base, a first conductive metal layer disposed on the base; and a first hardmask layer disposed on the first conductive metal layer. Metal lines are formed by subtractive etching. The metal lines have negative tapered sidewalls, and an opening is formed between adjacent metal lines. A first interlevel dielectric layer is deposited in the openings. A portion of the first interlevel dielectric layer is removed to form trench openings having positive tapered sidewalls. A dielectric layer is deposited in one of the openings. A liner layer and a second conductive metal layer are deposited in the other trench openings. The liner layer and the second conductive metal layer are recessed. A second hardmask layer is deposited on a top surface of the liner layer and the second conductive metal layer.

20 Claims, 8 Drawing Sheets

(51) Int. Cl.
*H01L 21/768* (2006.01)
*H01L 21/033* (2006.01)

(56) References Cited

U.S. PATENT DOCUMENTS

| | | |
|---|---|---|
| 9,735,029 B1 | 8/2017 | Chu et al. |
| 9,793,164 B2 | 10/2017 | Machkaoutsan et al. |
| 9,960,110 B2 | 5/2018 | Boyanov |
| 2016/0056104 A1 | 2/2016 | Bouche et al. |
| 2016/0204002 A1 | 7/2016 | Wallace et al. |
| 2016/0329278 A1 | 11/2016 | Bouche et al. |
| 2017/0140986 A1 | 5/2017 | Machkaoutsan et al. |
| 2018/0096932 A1 | 4/2018 | Xie et al. |
| 2018/0315648 A1 | 11/2018 | Ke et al. |
| 2019/0273019 A1 | 9/2019 | Mullick et al. |
| 2019/0348322 A1 | 11/2019 | Mullick et al. |
| 2020/0058585 A1 | 2/2020 | Xu et al. |

OTHER PUBLICATIONS

List of IBM Patents or Patent Applications Treated as Related.

BACK END OF LINE STRUCTURES WITH METAL LINES WITH ALTERNATING PATTERNING AND METALLIZATION SCHEMES

BACKGROUND

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and poly-crystalline silicon. The BEOL interconnects are typically made of multiple metals; the bulk of the conductor is copper. If copper diffuses into the FEOL silicon-based devices, it can cause shorting or alter sensitive transistor characteristics and render the semiconductor useless. This is the reason for the MOL connection. BEOL generally begins when the first layer of metal is deposited on the wafer. BEOL includes contacts, insulating layers (dielectrics), metal levels, and bonding sites for chip-to-package connections.

Generally, ICs include a complex network of conductive interconnects fabricated on a semiconductor substrate in which semiconductor devices have been formed. Efficient routing of these interconnects requires formation of multi-level or multilayered schemes, such as, for example, single or dual damascene wiring structures.

The BEOL is the second portion of IC fabrication where the individual devices (transistors, capacitors, resistors, etc.) get interconnected with wiring on the wafer, i.e., the metallization layer. Common metals are copper interconnects and aluminum interconnects. BEOL generally begins when the first layer of metal is deposited on the wafer. BEOL includes contacts, insulating layers (dielectrics), metal levels, and bonding sites for chip-to-package connections.

SUMMARY

Embodiments described herein provide methods of forming interconnect structures.

For example, one exemplary embodiment includes a method for forming an interconnect structure. The method comprises forming an interconnect structure comprising a base, a first conductive metal layer disposed on the base, and a first hardmask layer disposed on the first conductive metal layer. The method further comprises forming metal lines by patterning the first hardmask layer and the first conductive metal layer above the base by subtractive etching. The metal lines have negative tapered sidewalls and an opening is formed between adjacent metal lines. The method further comprises depositing a first interlevel dielectric layer in the openings between the adjacent metal lines. The method further comprises removing a portion of the first interlevel dielectric layer to form trench openings having positive tapered sidewalls. The method further comprises depositing a dielectric layer in a trench opening. The method further comprises depositing a liner layer on the exterior surfaces of the other trench openings. The method further comprises depositing a second conductive metal layer on the liner layer. The method further comprises recessing the liner layer and the second conductive metal layer. The method further comprises depositing a second hardmask layer on a top surface of the liner layer and the second conductive metal layer.

Another exemplary embodiment includes an interconnect structure comprising a plurality of metal lines, wherein respective ones of the metal lines have an alternating positive tapered shape or a negative tapered shape. A first interlevel dielectric layer is disposed between adjacent metal lines. A first hardmask layer is disposed on a top surface of the metal lines having a negative tapered shape. A second hardmask layer is disposed on a top surface of the metal lines having a positive tapered shape. The metal lines having a positive tapered shape comprise a sidewall metal liner layer.

These and other features, objects and advantages of the present invention will become apparent from the following detailed description of illustrative embodiments thereof, which is to be read in connection with the accompanying drawings.

DETAILED DESCRIPTION

Figure 1:
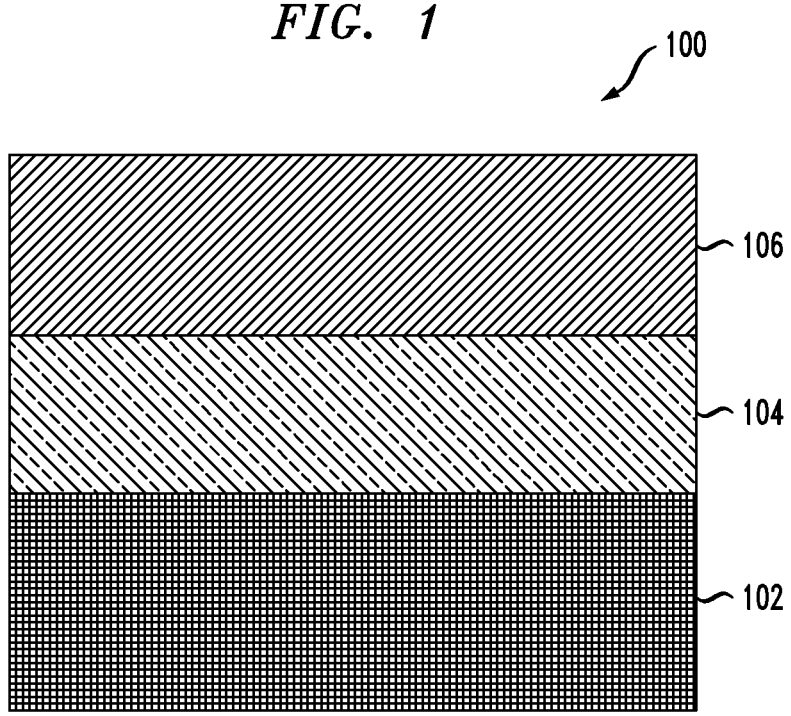
FIG. 1 is a cross sectional view of a semiconductor structure at a first-intermediate fabrication stage, according to an illustrative embodiment.

Embodiments of the present invention generally relate to a method of forming interconnects having alternating cap layers on a BEOL structure of an integrated circuit. With the IC being reduced in size over the years, the interconnect structure has also been reduced accordingly. Thus, in recent technology generations, numerous design constraints and rules have been developed that bound the patterns of cells in an IC. The rules and constraints take into consideration margins of error in locating the cells in the substrate, ways to reduce the magnitude of leakage, as well as other considerations to assure the performance of the resulting integrated circuit. For example, rules delineate minimum distances between structures of cells, lines, vias, and the like. Metal direction relative to the gate material, metal layer chosen for power distribution within the cell, cell height, metal pitch, etc., are all constraints of a chosen pattern or physical layout of the cells.

As stated above, one constraint is the metal pitch. Metal pitch determines the accessibility of cells so metal pitch directly impacts the cell density of the integrated circuit. Further, the length of interconnections between cells impacts the performance. For instance, longer lines have increased resistance, increasing heat dissipation in the integrated circuit. Longer lines also increase the capacitance of the overall design. Thus, while the first metallization layer is typically set to the tightest wire pitch, all remaining metallization layers of common thickness are constrained to a constant minimum metal pitch that facilitates interconnection of the cells. Current integrated circuits typically have six to eight metallization layers.

When interconnects further scale down to a metal pitch of less than 25 nanometers (nm), there are challenges that exist. Presently, there are several approaches to these challenges. One approach is a damascene based metallization technique. However, this approach has dielectric pillar stability issues, and cannot form an alternative metal capping layer for fully aligned vias. A second approach is a subtractive metal etch. This approach also has issues with metal pillar etching at sub 25 nm pitch as well as metal pillar stability issues.

Accordingly, embodiments of the present invention provide a solution to interconnect technology for metal pitch of, for example, less than 25 nm. The methods disclosed herein can obtain a tight metal pitch patterning without pattern collapse, tight metal formation with alternative capping material for fully aligned vias and a tight metal pitch cut without misalignment.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Illustrative embodiments for forming a semiconductor device will be described below with reference to FIGS. 1-8B. Note that the same reference numeral (100) is used to denote the semiconductor structure throughout the various intermediate fabrication stages illustrated in FIGS. 1 through 8B. Note also that the semiconductor structure described herein can also be considered a semiconductor device and/or an integrated circuit, or some part thereof. For the purpose of clarity, some fabrication steps leading up to the production of the semiconductor structure as illustrated in FIGS. 1-8B are omitted. In other words, one or more well-known processing steps which are not illustrated but are well-known to those of ordinary skill in the art have not been included in the figures.

FIG. 1 shows a semiconductor structure 100 at a starting point according to an illustrative embodiment of the present invention. Semiconductor structure 100 comprises a base 102. In general, base 102 comprises a semiconductor substrate. The semiconductor substrate comprises a silicon substrate, such as a silicon wafer. In one illustrative embodiment, disposed on the semiconductor substrate is a BEOL stack. The BEOL stack comprises a plurality of metallization layers, dielectric layers and via layers. As one skilled in the art would understand, base 102 can be, for example, BEOL interconnects with BEOL interlevel dielectric (ILD) fill; a MOL contact with MOL ILD fill and FEOL devices.

A conductive metal layer 104 is deposited on base 102 using a suitable deposition process, for example, atomic layer deposition (ALD), chemical vapor deposition (CVD), plasma enhanced chemical vapor deposition (PECVD), physical vapor deposition (PVD), chemical solution deposition or other like processes. Suitable conductive metals for layer 104, i.e., metallization Mx−1 level (see FIGS. 8A and 8B), are any conductive material that can be dry etched or patterned including, for example, aluminum (Al), chromium (Cr), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, conductive metal layer 104 is formed by one or more of Al, Ru, Ta, Ti or W. In one embodiment, conductive metal layer 104 is Ru. If desired a liner layer (not shown) can be deposited first before deposition of the conductive metal layer. The liner layer can be, for example, a TiN layer. In general, liner layer can have a thickness ranging from about 0.5 to about 3 nm.

Next, a hardmask layer 106 is then deposited on conductive metal layer 104 using a suitable deposition process, for example, ALD, CVD, PECVD, PVD, chemical solution deposition or other like processes. Suitable material for hardmask layer 106 includes, for example, $SiO_2$, SiN, SiOCN, SiBCN, SiOC, SiC, etc., or combination of those layers.

Figure 2A:
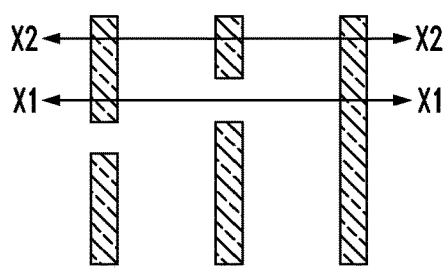
FIG. 2A is a top view of a semiconductor structure showing the X1 axis and the X2 axis, at a second-intermediate fabrication stage, according to an illustrative embodiment.
Figure 2B:
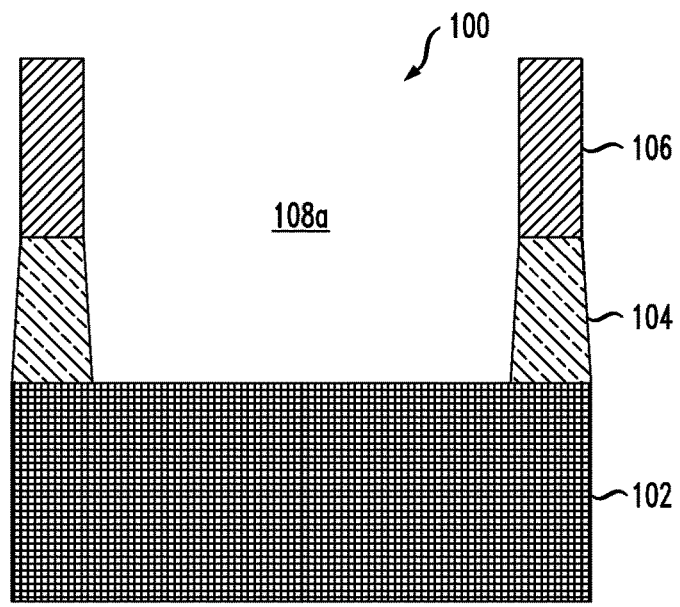
FIG. 2B is a cross sectional view of the semiconductor structure taken along the X1 axis of FIG. 2A at the second-intermediate fabrication stage, according to an illustrative embodiment.
Figure 2C:
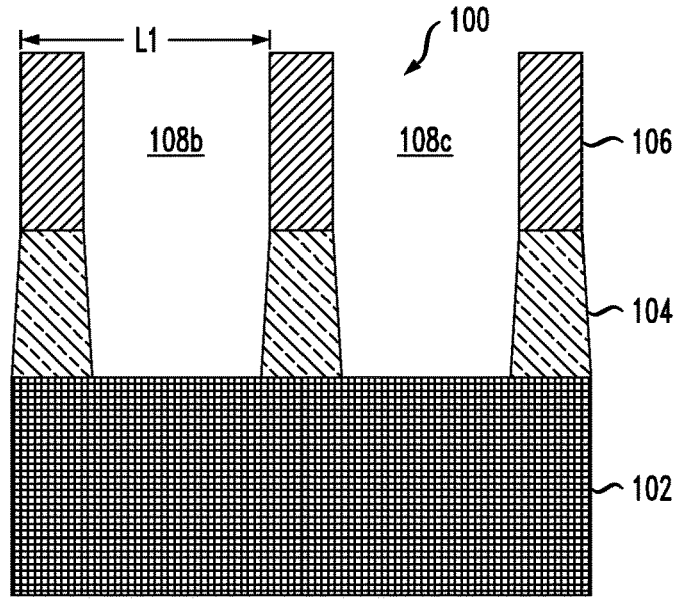
FIG. 2C is a cross sectional view of the semiconductor structure taken along the X2 axis of FIG. 2A at the second-intermediate fabrication stage, according to an illustrative embodiment.

FIG. 2A illustrates a top view of semiconductor structure 100 showing the X1 axis and the X2 axis. FIG. 2B is a cross sectional view of a semiconductor structure taken along the X1 axis of FIG. 2A, and FIG. 2C is a cross sectional view of a semiconductor structure taken along the X2 axis of FIG. 2A, at a second-intermediate fabrication stage. Referring to FIG. 2B, hardmask layer 106 is patterned using a subtractive metal etch to etch only those portions of conductive metal layer 104 that will become metal lines. Accordingly, a subtractive patterning process is performed using lithography and a metal etch process to form metal lines comprising the conductive metal layer 104 and the hardmask layer 106 on top of base 102 at a desired location along with trench opening 108a. The unwanted metals are removed, e.g., by RIE. As shown in FIG. 2C, trench openings 108b and 108c are formed in the conductive metal layer 104 and the hardmask layer 106 having a metal pitch L1. In one embodiment, the metal pitch L1 can range from about 40 to about 100 nm. Further, as can be seen, the conductive metal layer 104, i.e., metal line, in each of FIGS. 2B and 2C will have negative tapered sidewalls, i.e., a top of the metal line is narrower in width than a bottom of the metal line as viewed in the cross section.

Figure 3A:
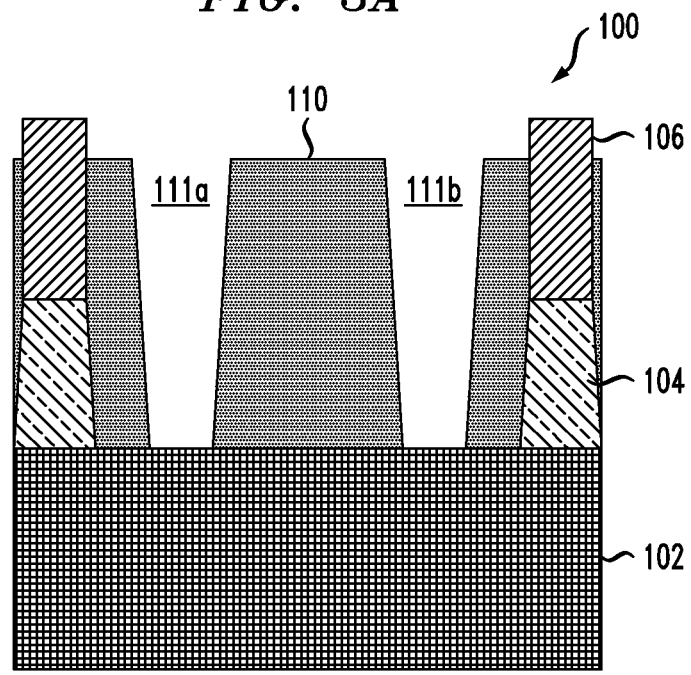
FIG. 3A is a cross sectional view of the semiconductor structure taken along the X1 axis of FIG. 2A at a third-intermediate fabrication stage, according to an illustrative embodiment.
Figure 3B:
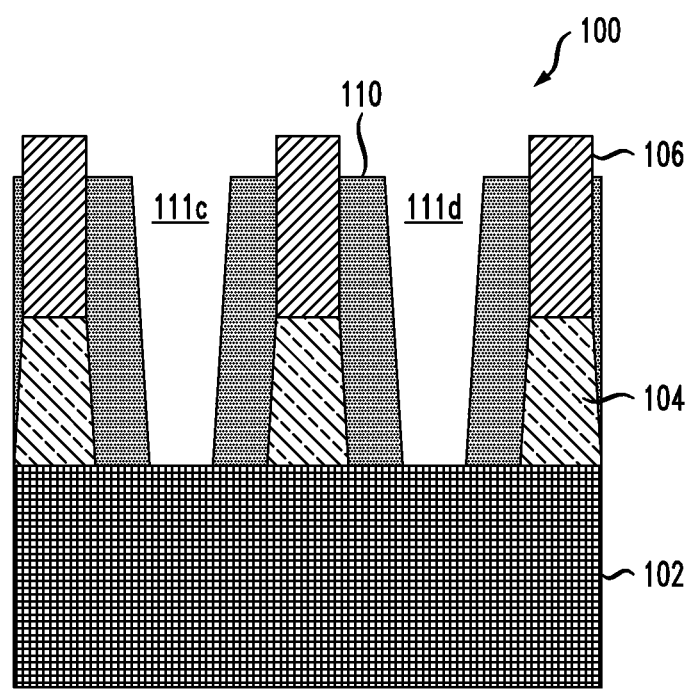
FIG. 3B is a cross sectional view of the semiconductor structure taken along the X2 axis of FIG. 2A at the third-intermediate fabrication stage, according to an illustrative embodiment.

FIG. 3A is a cross sectional view of the semiconductor structure 100 taken along the X1 axis of FIG. 2A, and FIG. 3B is a cross sectional view of the semiconductor structure 100 taken along the X2 axis of FIG. 2A, at a third-intermediate fabrication stage. Referring to FIGS. 3A and 3B, an interlevel dielectric (ILD) layer 110 deposited in trench openings 108a, 108b and 108c and on the top surface base 102. The ILD layer 110 includes, for example, any suitable dielectric material such as silicon oxide, silicon nitride, hydrogenated silicon carbon oxide, low-k dielectrics, ultralow-k dielectrics, flowable oxides, porous dielectrics, or organic dielectrics including porous organic dielectrics. Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra low-k dielectric materials have a nominal dielectric constant less than 2.5. Suitable ultra low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like.

The ILD layer 110 may be formed using any suitable deposition techniques including CVD, ALD, PVD, PECVD, chemical solution deposition or other like processes. ILD layer 110 is conformally deposited such that it will pinch-off the metal tip-to-tip region, i.e., FIG. 3A shows the ILD layer 110 pinching off the center region between the trench openings 111a and 111b as discussed below.

Next, ILD layer 110 is subjected to an etching process such as an anisotropic reactive ion etching (RIE) to form trench openings 111a and 111b in FIG. 3A and trench openings 111c and 111d in FIG. 3B. As can be seen, the trench openings 111a, 111b, 111c and 111d will have positive tapered sidewalls, i.e., the top of trench openings 111a, 111b, 111c and 111d is wider in width than the bottom of trench openings 111a, 111b, 111c and 111d as viewed in the cross section.

Figure 4A:
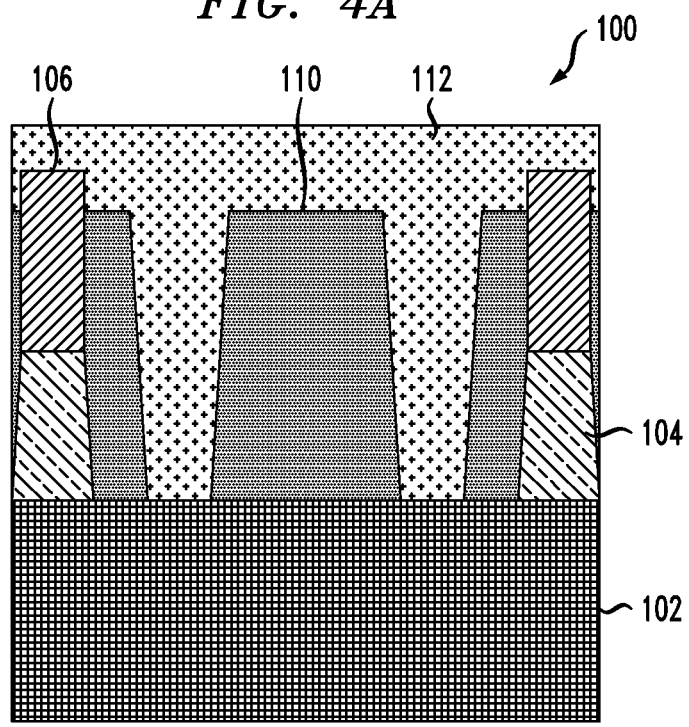
FIG. 4A is a cross sectional view of the semiconductor structure taken along the X1 axis of FIG. 2A at a fourth-intermediate fabrication stage, according to an illustrative embodiment.
Figure 4B:
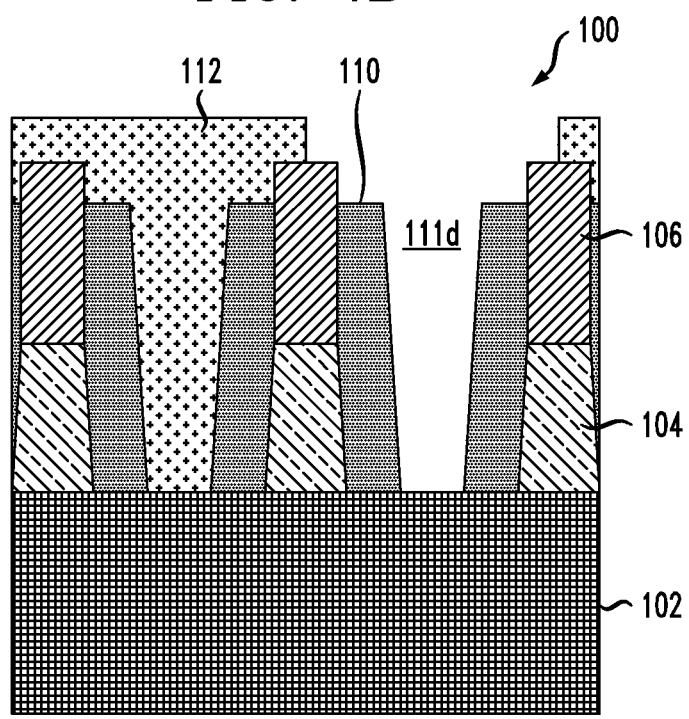
FIG. 4B is a cross sectional view of the semiconductor structure taken along the X2 axis of FIG. 2A at the fourth-intermediate fabrication stage, according to an illustrative embodiment.

FIG. 4A is a cross sectional view of the semiconductor structure 100 taken along the X1 axis of FIG. 2A, and FIG. 4B is a cross sectional view of the semiconductor structure 100 taken along the X2 axis of FIG. 2A, at a fourth-intermediate fabrication stage. Referring to FIGS. 4A and 4B, an optical planarization layer (OPL) 112 is deposited in trench openings 111a, 111b, 111c and 111d and over the top surface of hardmask layer 106 using traditional techniques for forming such materials, e.g., spin-coating, deposition, etc. OPL layer 112 can then be planarized by, for example, a planarization process such as CMP. Next, OPL layer 112 is patterned to selectively remove OPL 112 from trench opening 111d using lithography and etching processes which etch OPL 112 selective to surrounding materials, such as hardmask 106 and ILD 110.

Figure 5A:
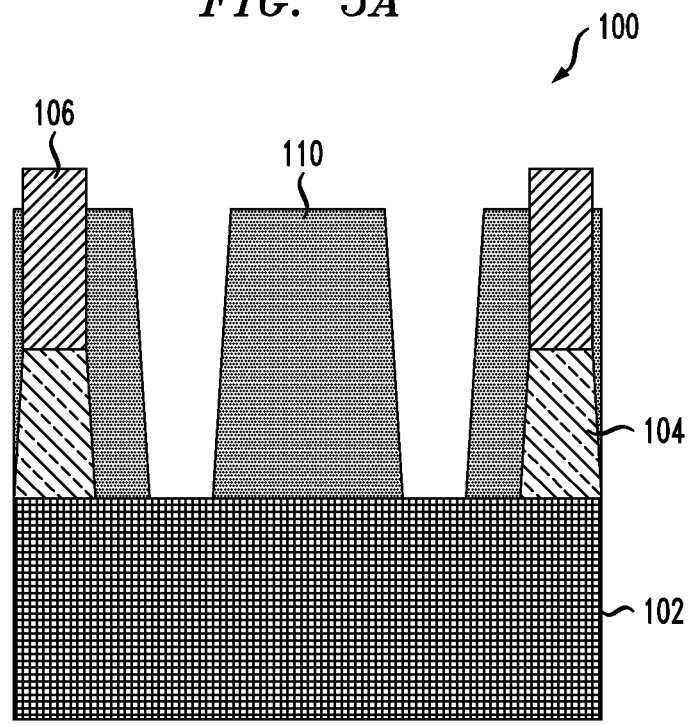
FIG. 5A is a cross sectional view of the semiconductor structure taken along the X1 axis of FIG. 2A at a fifth-intermediate fabrication stage, according to an illustrative embodiment.
Figure 5B:
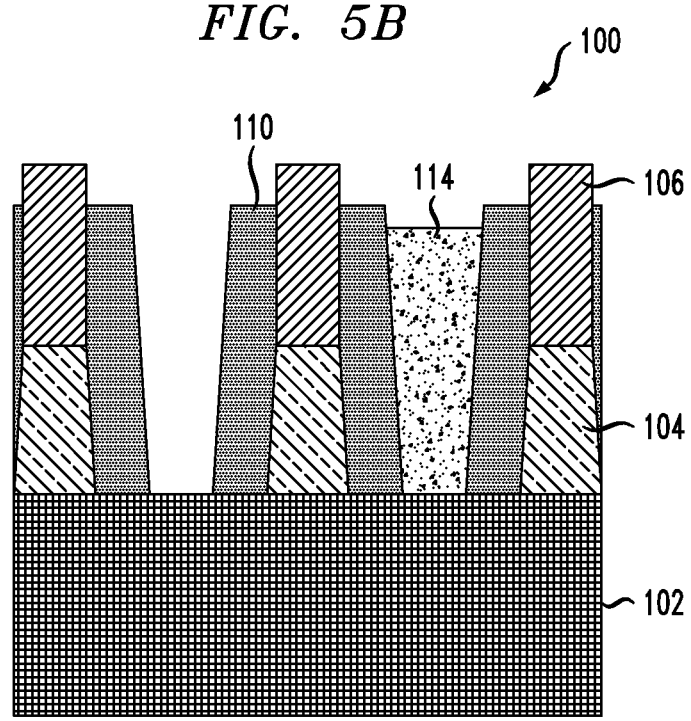
FIG. 5B is a cross sectional view of the semiconductor structure taken along the X2 axis of FIG. 2A at the fifth-intermediate fabrication stage, according to an illustrative embodiment.

FIG. 5A is a cross sectional view of the semiconductor structure 100 taken along the X1 axis of FIG. 2A, and FIG. 5B is a cross sectional view of the semiconductor structure 100 taken along the X2 axis of FIG. 2A, at a fifth-intermediate fabrication stage. During this stage, a dielectric material 114 is deposited into trench opening 111d as shown in FIG. 5B. Dielectric material 114 can be, for example, Hafnium Oxide (HfOx), Aluminum Oxide (AlOx), SiN, SiOC, SiC, or any suitable dielectric. Dielectric material 114 may be deposited by using conventional techniques such as CVD, PVD, or ALD as is well known in the art.

Next, OPL 112 is then selectively removed from the semiconductor structure 100 using various etching processes such as, for example, a plasma ash etching process, as shown in FIGS. 5A and 5B. The plasma ash etching process is selective to OPL 112 and not hardmask layer 106, ILD 110 and dielectric layer 114. Alternatively, a dry etching process, for example, RIE may be used.

Figure 6A:
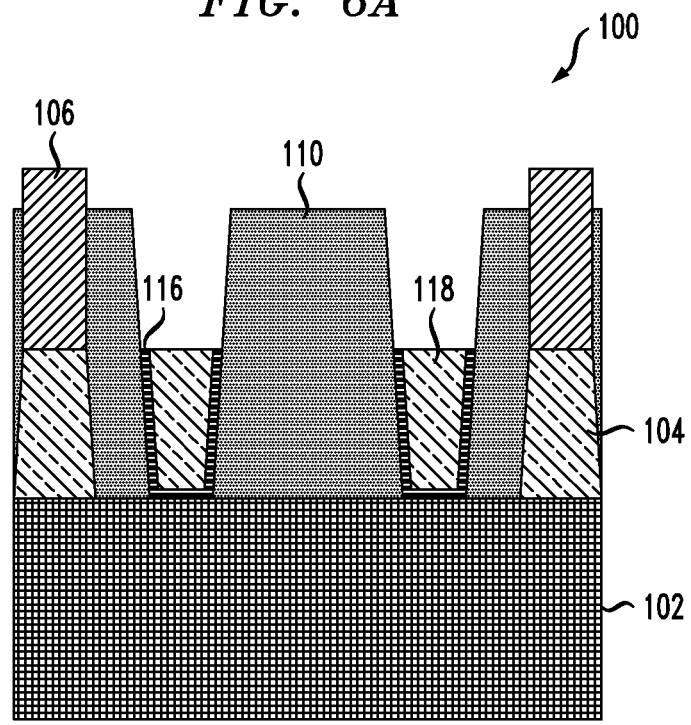
FIG. 6A is a cross sectional view of the semiconductor structure taken along the X1 axis of FIG. 2A at a sixth-intermediate fabrication stage, according to an illustrative embodiment.
Figure 6B:
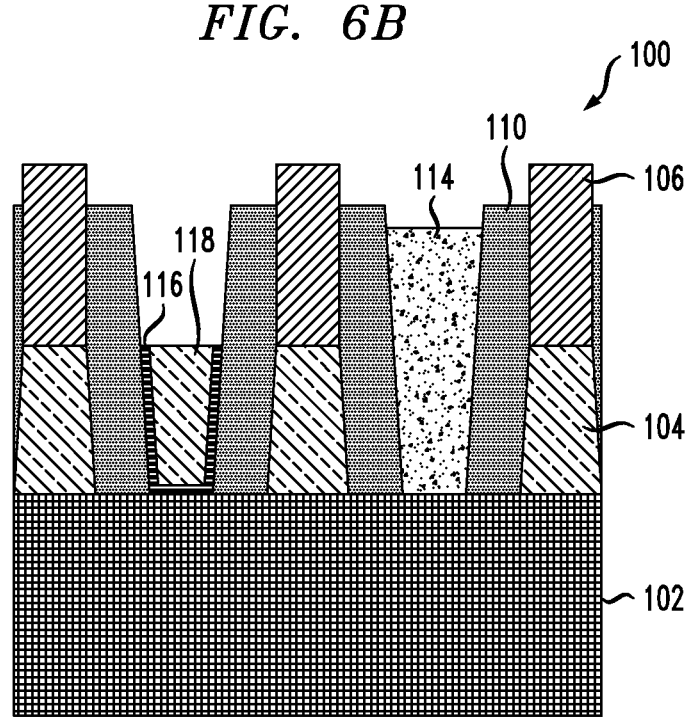
FIG. 6B is a cross sectional view of the semiconductor structure taken along the X2 axis of FIG. 2A at the sixth-intermediate fabrication stage, according to an illustrative embodiment.

FIG. 6A is a cross sectional view of the semiconductor structure 100 taken along the X1 axis of FIG. 2A, and FIG. 6B is a cross sectional view of the semiconductor structure 100 taken along the X2 axis of FIG. 2A, at a sixth-intermediate fabrication stage. During this stage, liner layer 116 is deposited on the bottom surfaces and sidewalls of each of the trench openings using a conventional deposition process, for example, CVD, PECVD, PVD, plating, thermal or e-beam evaporation, sputtering, etc. In one embodiment, liner layer 116 is a metal liner. Suitable material for liner layer 116 includes, for example, TiN, TaN, etc. In general, liner layer 116 can have a thickness ranging from about 0.3 nm to about 3 nm.

Next, a conductive metal layer 118 is deposited on liner layer 116 using a suitable deposition process, for example, ALD, CVD, PECVD, PVD, chemical solution deposition or other like processes. Suitable conductive metals for layer 118 are any conductive material that can be dry etched or patterned including, for example, Al, Cr, Hf, Ir, Mo, Nb, Os, Re, Rh, Ru, Ta, Ti, W, V, Zr, and alloys thereof. In one embodiment, conductive metal layer 118 is formed by one or more of Al, Ru, Ta, Ti or W. In one embodiment, conductive metal layer 118 is Ru. The liner layer 116 and conductive metal layer 118 are then recessed to below a top surface of the trench openings.

Figure 7A:
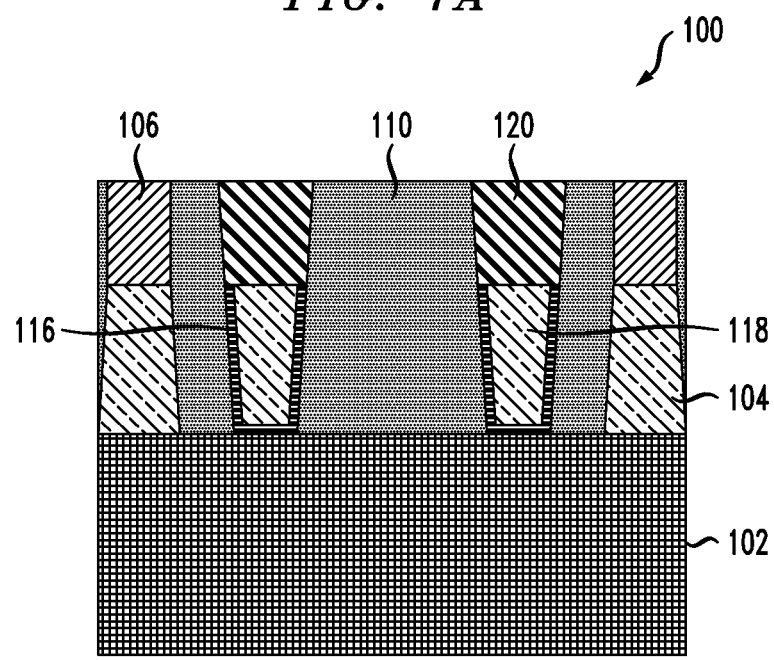
FIG. 7A is a cross sectional view of the semiconductor structure taken along the X1 axis of FIG. 2A at a seventh-intermediate fabrication stage, according to an illustrative embodiment.
Figure 7B:
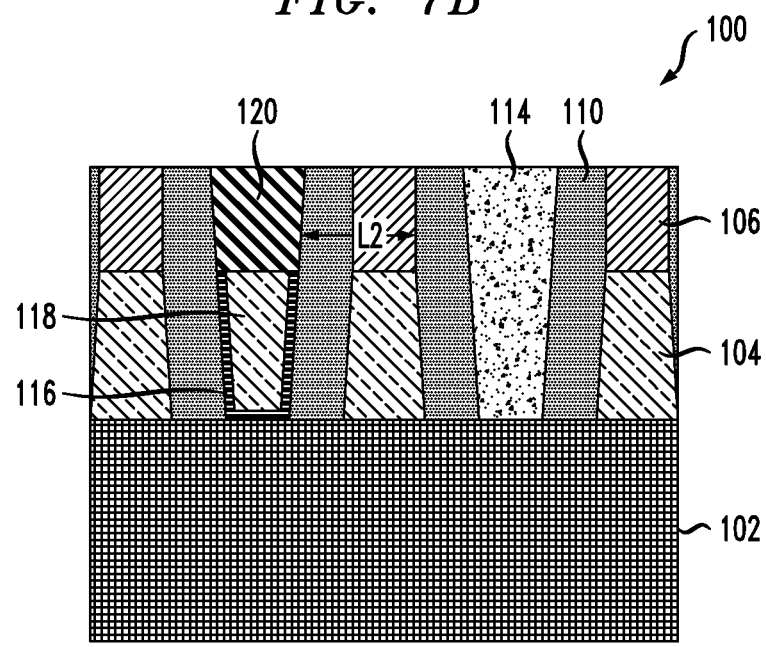
FIG. 7B is a cross sectional view of the semiconductor structure taken along the X2 axis of FIG. 2A at the seventh-intermediate fabrication stage, according to an illustrative embodiment.

FIG. 7A is a cross sectional view of the semiconductor structure 100 taken along the X1 axis of FIG. 2A, and FIG. 7B is a cross sectional view of the semiconductor structure 100 taken along the X2 axis of FIG. 2A, at a seventh-intermediate fabrication stage. During this stage, a hardmask layer 120 is deposited on the top surface of liner layer 116 and conductive metal layer 118 and fills the trench openings. The material for hardmask layer 120 is different than the material for hardmask layer 106. In one illustrative embodiment, the material for hardmask layer 120 has a different etch rate or etch characteristics during RIE than the material for hardmask layer 106. For example, when the material for one hardmask is SiN, the other material may be SiOC. In another illustrative embodiment, when the material for one hardmask is $SiO_2$, the other material may be SiN. In another illustrative embodiment, when the material for one hardmask is SiC, the other material may be SiN. In another illustrative embodiment, when the material for one hardmask is SiBCN, the other material may be SiOCN. As shown in FIG. 7B, the semiconductor structure 100 will have a metal pitch L2. In one embodiment, metal pitch L2 will be less than 25 nm, e.g., a metal pitch ranging from about 20 to about 50 nm.

Figure 8A:
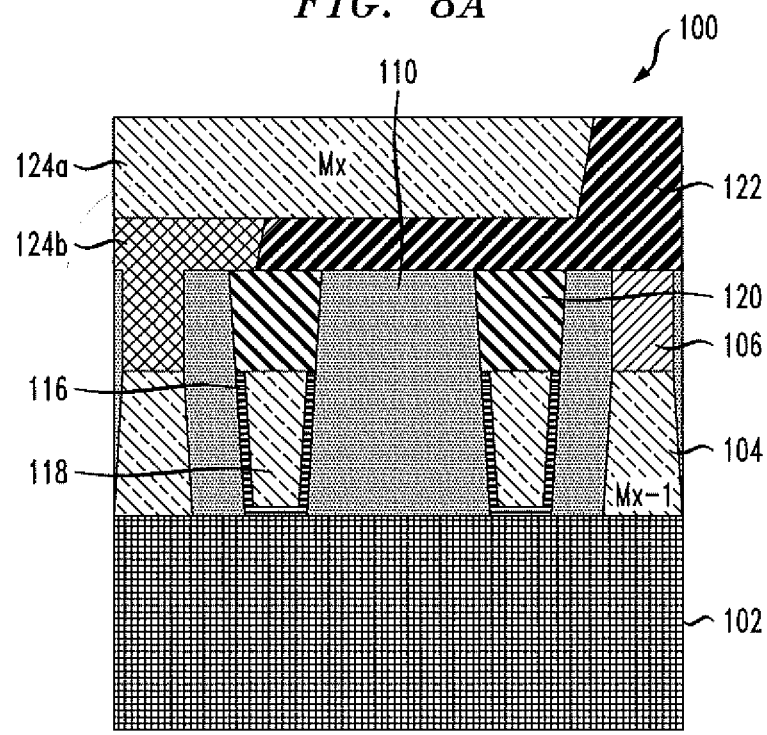
FIG. 8A is a cross sectional view of the semiconductor structure taken along the X1 axis of FIG. 2A at an eighth-intermediate fabrication stage, according to an illustrative embodiment.
Figure 8B:
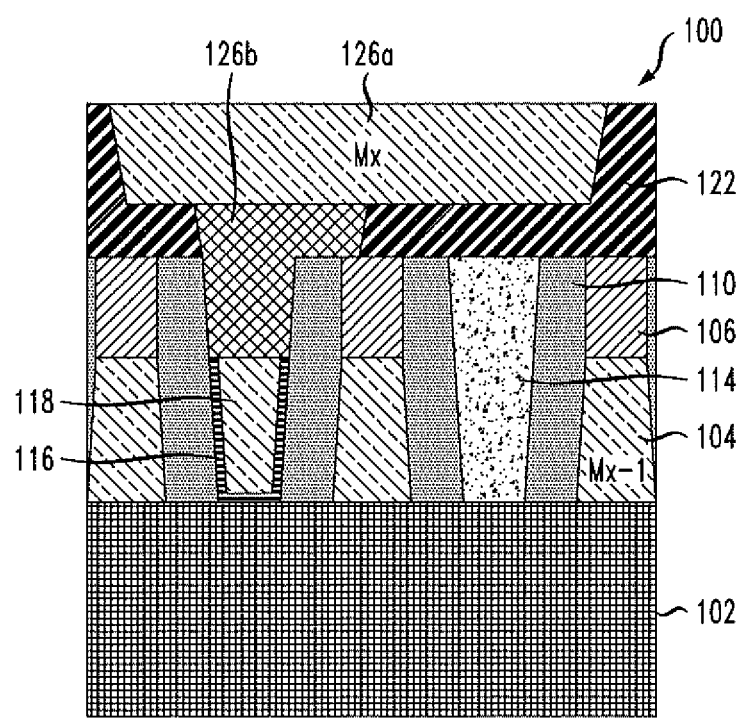
FIG. 8B is a cross sectional view of the semiconductor structure taken along the X2 axis of FIG. 2A at the eighth-intermediate fabrication stage, according to an illustrative embodiment.

FIG. 8A is a cross sectional view of the semiconductor structure 100 taken along the X1 axis of FIG. 2A, and FIG. 8B is a cross sectional view of the semiconductor structure 100 taken along the X2 axis of FIG. 2A, at an eighth-intermediate fabrication stage. Referring to FIGS. 8A and 8B, an ILD layer 122 is deposited over the top surface of semiconductor structure 100 using conventional techniques such as, for example, CVD. ILD layer 122 can be any material as discussed above for ILD layer 110. Next, upper metal line trenches 124a and 126a, i.e., metallization Mx level, are formed by selectively removing ILD layer 122 using, for example ME. After the formation of trenches 124a and 126a, via 124b is formed by using a conventional lithography process (i.e., depositing an OPL or photoresist followed by patterning) to define the lithography opening for via 124b, followed by a selective RIE to etch the ILD 122 present under the trench 124a (not shown). A second selective RIE is then carried out to etch hardmask 106, which is selective to ILD 110 and hardmask 120 (see FIG. 8A). Via 126b is formed by using a lithography process to define the lithography opening for via 126b, followed by a selective RIE to etch the ILD 122 present under the trench 126a (not shown). Next, another selective RIE is carried to etch hardmask 120, which is selective to ILD 110 and hardmask 106 (FIG. 8B).

Once vias 124b and 126b are formed, all lithography patterning material such as OPL or photoresist, is removed. Next, an optional thin metal liner such as TiN can be deposited in the vias 124b and 126b and trenches 124a and 126a (not shown) by conventional techniques. Next, a conductive material is then deposited within the trenches 124a and 126a and vias 124b and 126b by a suitable deposition process including, but not limited to, CVD, PECVD, PVD, plating, thermal or e-beam evaporation, sputtering, etc. The conductive material can be the same or different conductive metal as for conductive metal layer 104. In one embodiment, the conductive material includes, for example, Al, W, Cu, Co. Ru, Mo, etc. After depositing the conductive material, any overburden conductive material can be removed by, for example, CMP.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. An interconnect structure, comprising:
   a plurality of metal lines, wherein respective ones of the metal lines have an alternating positive tapered shape or a negative tapered shape;
   a first interlevel dielectric layer disposed between adjacent metal lines;
   a first hardmask layer disposed on a top surface of the metal lines having a negative tapered shape; and
   a second hardmask layer disposed on a top surface of the metal lines having a positive tapered shape;
   wherein the metal lines having a positive tapered shape comprise a sidewall metal liner layer.

2. The interconnect structure of claim 1, wherein the plurality of metal lines extends vertically from a back end of the line structure.

3. The interconnect structure of claim 1, wherein the first hardmask layer has a different etch selectivity than the second hardmask layer.

4. The interconnect structure of claim 1, wherein the plurality of metal lines comprise a same or different first conductive metal.

5. The interconnect structure of claim 1, wherein the first interlevel dielectric layer has an opening having a positive tapered shape, the opening comprising a dielectric material disposed therein.

6. The interconnect structure of claim 5, further comprising:
   a second interlevel dielectric layer disposed on a top surface of the interconnect structure, wherein the second interlevel dielectric layer has a trench and a contiguous via configured to expose a top surface of one of the metal lines having a negative tapered shape; and
   a second conductive metal disposed in the trench and the contiguous via.

7. The interconnect structure of claim 5, further comprising:
   a second interlevel dielectric layer disposed on a top surface of the interconnect structure, wherein the second interlevel dielectric layer has a trench and a contiguous via configured to expose a top surface of one of the metal lines having a positive tapered shape; and
   a third conductive metal disposed in the trench and the contiguous via.

8. The interconnect structure of claim 1, wherein the plurality of metal lines are disposed on a substrate.

9. The interconnect structure of claim 1, further comprising a Mx level disposed on a top surface of the interconnect structure.

10. An integrated circuit comprising one or more interconnect structures, wherein at least one of the interconnect structures comprises:
    a plurality of metal lines, wherein respective ones of the metal lines have an alternating positive tapered shape or a negative tapered shape;
    a first interlevel dielectric layer disposed between adjacent metal lines;
    a first hardmask layer disposed on a top surface of the metal lines having a negative tapered shape; and
    a second hardmask layer disposed on a top surface of the metal lines having a positive tapered shape;
    wherein the metal lines having a positive tapered shape comprise a sidewall metal liner layer.

11. The integrated circuit of claim 10, wherein the plurality of metal lines extends vertically from a back end of the line structure.

12. The integrated circuit of claim 10, wherein the first hardmask layer has a different etch selectivity than the second hardmask layer.

13. The integrated circuit of claim 10, wherein the plurality of metal lines comprise a same or different first conductive metal.

14. The integrated circuit of claim 10, wherein the first interlevel dielectric layer has an opening having a positive tapered shape, the opening comprising a dielectric material disposed therein.

15. The integrated circuit of claim 14, further comprising:
    a second interlevel dielectric layer disposed on a top surface of the interconnect structure, wherein the second interlevel dielectric layer has a trench and a contiguous via configured to expose a top surface of one of the metal lines having a negative tapered shape; and a second conductive metal disposed in the trench and the contiguous via.

16. The integrated circuit of claim 14, further comprising:
a second interlevel dielectric layer disposed on a top surface of the interconnect structure, wherein the second interlevel dielectric layer has a trench and a contiguous via configured to expose a top surface of one of the metal lines having a positive tapered shape; and
a third conductive metal disposed in the trench and the contiguous via.

17. The integrated circuit of claim 10, wherein the plurality of metal lines are disposed on a substrate.

18. The integrated circuit of claim 10, further comprising a Mx level disposed on a top surface of the interconnect structure.

19. An interconnect structure, comprising:
a plurality of metal lines, wherein respective ones of the metal lines have an alternating positive tapered shape or a negative tapered shape;
an interlevel dielectric layer disposed between adjacent metal lines, the interlevel dielectric layer having an opening therein having a positive tapered shape;
a dielectric material disposed in the opening of the interlevel dielectric layer having the positive tapered shape;
a first hardmask layer disposed on a top surface of the metal lines having a negative tapered shape;
a second hardmask layer disposed on a top surface of the metal lines having a positive tapered shape; and
a Mx level disposed on a top surface of the interconnect structure;
wherein the metal lines having a positive tapered shape comprise a sidewall metal liner layer.

20. The interconnect structure of claim 19, wherein the first hardmask layer has a different etch selectivity than the second hardmask layer.

\* \* \* \* \*